United States Patent [19]

Pellegrino et al.

[11] Patent Number: 5,504,769
[45] Date of Patent: Apr. 2, 1996

[54] SEMICONDUCTOR LASER HAVING LOW CURRENT THRESHOLD

[75] Inventors: Sergio Pellegrino, Torino; Massimo Del Giudice, Alzano Lombardo; Fabio Vidimari, Milan, all of Italy

[73] Assignee: Alcatel Italia S.p.A., Milan, Italy

[21] Appl. No.: 196,289

[22] Filed: Feb. 14, 1994

[30] Foreign Application Priority Data

Feb. 12, 1993 [IT] Italy .................................. MI93A0253

[51] Int. Cl.$^6$ ...................................................... H01S 3/18
[52] U.S. Cl. ............................................................ 372/46
[58] Field of Search ........................................ 372/45, 46

[56] References Cited

U.S. PATENT DOCUMENTS

| | | | |
|---|---|---|---|
| 4,644,552 | 2/1987 | Ohshima et al. | 372/46 |
| 5,048,038 | 9/1991 | Brennan et al. | 372/46 |
| 5,151,914 | 9/1992 | Vidimari et al. | |
| 5,193,098 | 3/1993 | Welch et al. | 372/46 |

FOREIGN PATENT DOCUMENTS 0176028  4/1986  European Pat. Off. .
0433991  6/1991  European Pat. Off. .

OTHER PUBLICATIONS

"Implanted–Planar–Buried–Heterostructure, Graded–Index, Separate–Confinement–Heterostructure Laser in GaAs/AlGaAs" by. Vawter et al, Jul. 1989 IEEE Log Number 8929429, pp. 153–155.

Patent Abstracts of Japan, vol. 6, No. 140 (E–121) (1018) 29 Jul. 1982 & JP–A–57 063 882 (Nippon Denki) 17 Apr. 1982.

Patent Abstracts of Japan, vol. 7, No. 84 (E–168) (1229) 8 Apr. 1983 & JP–A–58 010 884 (Nippon Denki) 21 Jan 1983.

*Primary Examiner*—Rodney B. Bovernick
*Assistant Examiner*—Robert McNutt
*Attorney, Agent, or Firm*—Ware, Fressola, Van Der Sluys & Adolphson

[57] ABSTRACT

A semiconductor laser including a substrate, means for reducing the lateral current flow and means forming the active elements, wherein said means for reducing the lateral current flow are composed by at least three layers of which the external ones are entirely doped and the internal layers are doped only in the zones lateral to the active element so that these layers reduce the side current flow.

9 Claims, 3 Drawing Sheets

SEMICONDUCTOR LASER HAVING LOW CURRENT THRESHOLD

TECHNICAL FIELD

The present invention relates to semiconductor lasers having a substrate and means for reducing the side current flow as well as means for forming an active element and to a process for the production of such semiconductor lasers.

BACKGROUND OF THE INVENTION

As known, the solid state laser structures emit luminous energy from zones having side dimensions on the order of a few micrometers.

In order to obtain low laser threshold currents, high optical power emitted and hence maximum electro-to-optical conversion yield, it is necessary to make the current flow in the very small active zone only.

Various methods have been developed to confine the electric energy flow in the region of light emission, having as their object the maximization of the conversion yield.

For instance U.S. Pat. No. 5,151,914 discloses a device having a region blocking the current flow by means of a high resistivity layer obtained through implantation of transition (metallic) element ions. With this structure good results are obtained but the process is somewhat critical.

In an article by G. A. Vawter et al entitled "Implanted Planar Buried Heterostructure, Graded-Index, Separate Confinement Heterostructure Laser in GaAs/AlGaAs", IEEE 1989, it a laser structure is described with only one epitaxial growth and with the doping of the layers forming the region which blocks the current flow which is carried out through high energy ion implantation.

This structure has the drawback due to a low accuracy in the relative positioning between the active element and the blocking structure.

SUMMARY OF THE INVENTION

It is an object of the present invention to provide a process for constructing a laser structure which is capable of effectively blocking the current flow in the zones lateral to the active element, using simple and accurate techniques.

In accordance with the invention, therefore, the laser is structured with means for reducing side current flow which is composed with at least three layers, the internal layers of which are doped only in the side zones with respect to the active element, whereby these layers reduce the side current flow. The process for obtaining this device is to grow at least three layers through epitaxia for reducing side current flow, the external layers of which are completely doped and the internal layers of which are doped only in the side zones with respect to the active element, whereby these layers reduce the side current flow.

A characteristic feature of this invention is the manner in which the layers forming means for reducing the lateral current flow are doped.

Another feature of this invention is the accurate control of dimensions, positioning and resistivity of the various layers since simple and well known processes; i.e., epitaxial growth on a planar structure and low energy ion implantation, are used.

A further characteristic of this invention is the reduction in the stray capacitances of the device through proton bombardment. It results in a remarkable increase of the dynamic performances.

Among further advantages it is here mentioned only that devices produced in this way can operate with very low threshold currents, with high luminous emission power, at high modulation velocity and, moreover, the process also allows high production yields, especially in terms of uniformity and homogeneity of the resulting electrical and optical characteristics.

BRIEF DESCRIPTION OF THE DRAWINGS

The invention will be understood better from the following description of an embodiment thereof taken in conjunction with the attached drawings in which.

BEST MODE FOR CARRYING OUT THE INVENTION

Figure 1:
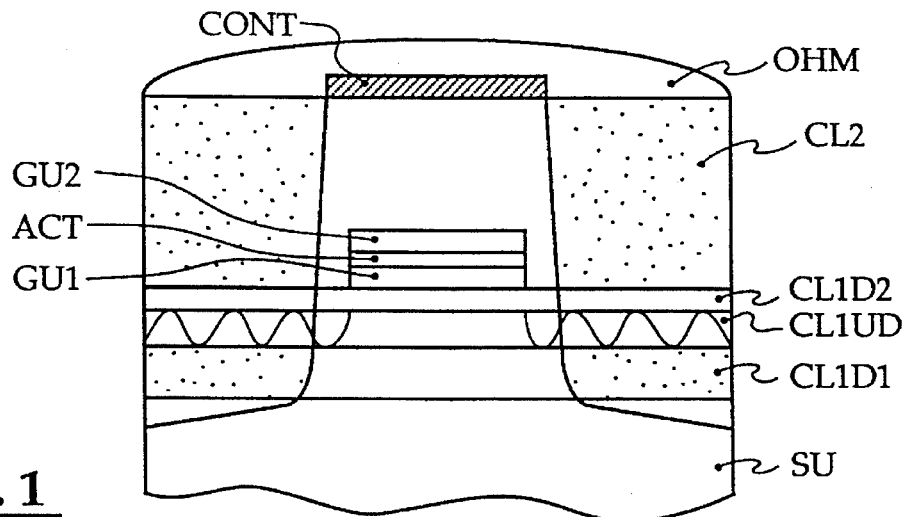
FIG. 1 shows the laser structure according to an embodiment of the present invention.

In FIG. 1 the laser structure is shown in accordance with an embodiment of the present invention.

The structure comprises a substrate SU on which the following layers are grown:

the layers CL1D1, CL1UD, CL1D2 for physical insulation and forming the optical guide and further capable of reducing the lateral current flow;

an optical confining layer GU1 of size smaller than the preceding layers;

an active layer ACT and a second active confining layer GU2 of the same size as GU1;

a layer CL2 for physical insulation and forming the optical guide that covers all the structure so far obtained;

a contact layer CONT of size comparable with GU1, and finally an ohmic contact layer OHM that covers all the structure.

In zones not underlying the layer CONT the structure so obtained will be subjected to a proton bombardment.

Layer CL1UD will be doped only in the zones not underlying the active layer ACT.

Layers SU, CL1D1, CL1D2 will be doped n-type and layers CL1UD and CL2 will be doped p-type.

A characteristic of this structure is the manner in which the longer layer CL1UD is doped, only in the zone not underlying the active element; in this way a structure is created, capable of blocking the lateral flow of dispersion current while leaving a central channel for the current flow capable of exciting the active element.

In the structure zones at the side of the active element where a proton bombardment will occur, a zone will be created, capable of further reducing the lateral current flow and, moreover, this perturbation in the crystalline structure will reduce the intrinsic stray capacitances of the device thus improving the dynamic performances.

Figure 2:
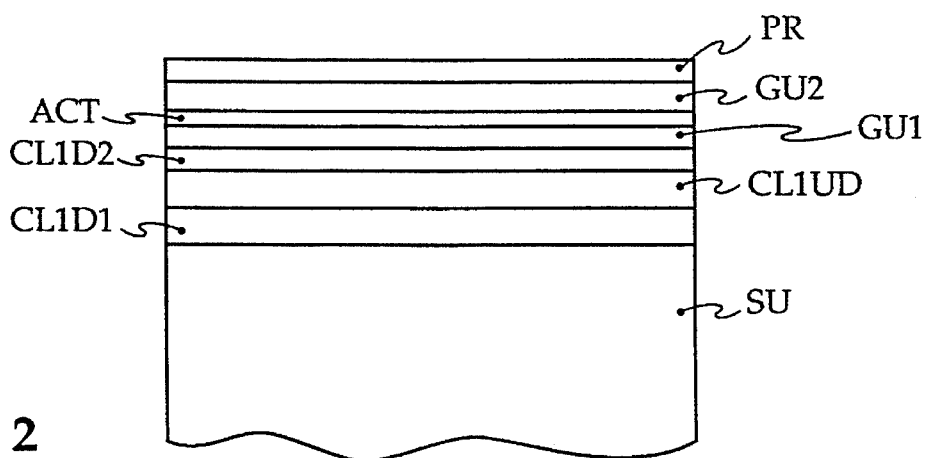
FIG. 2 shows the first epitaxial growth.

The process for manufacturing the laser starts, as shown in FIG. 2, with the epitaxial growth on a GaAs substrate SU of the following layers:

an InGaP layer CL1D1 doped n-type having a thickness suitable for creating, along with layers CL1UD, CL1D2 and GU1, a region of physical insulation and forming the optical guide between the substrate SU and active layer ACT;

a layer CL1UD having the same composition as CL1D1, grown deliberately undoped or with a very low doping level with respect to layers CL1D1 and CL1D2 and having a thickness suitable for a subsequent implantation process;

a layer CL1D2 having the same composition and the same type of doping as the layer CL1D1 and having further a thickness suitable for minimizing the flow of dispersion current through this layer;

an InGaAsP guide layer suitable for creating an electrical and optical confinement layer;

an undoped active layer ACT formed by an InGaAs alloy, having composition and thickness suitable for the stimulated emission of photons at the desired wave length;

a guide layer GU2 of the same composition as layer GU1; and finally a GaAs protective and removable layer PR having a thickness suitable for preventing the underlying layers from contamination.

Figure 3:
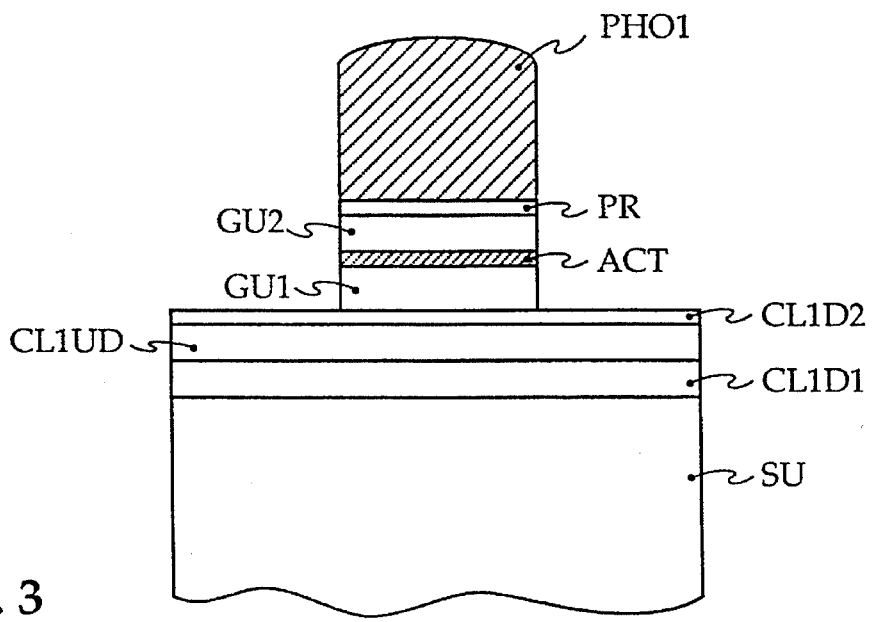
FIG. 3 defines the strip for the creation of the active layer.

As can be seen in FIG. 3, the photoresist strip PHO1 that will define the active layer of the laser is defined through photolitographic techniques; the layers PR, GU2, ACT and GU1 in the zones free from photoresist are then removed through ion bombardment or chemical etching.

Figure 4:
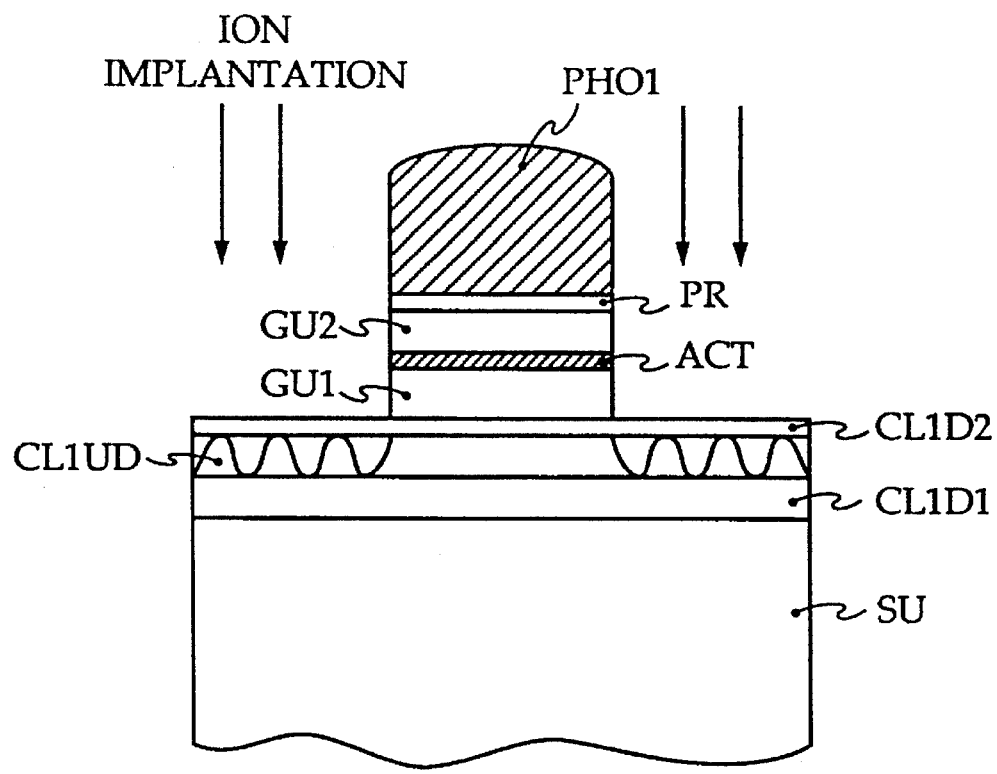
FIG. 4 shows the ion implantation.

In FIG. 4 one can see that the resulting structure is subjected to beryllium ion implantation in order to obtain the doping at the desired p-type level, in zones free from photoresist of layer CL1UD.

The implanted elements are distributed according to a Gaussian profile positioned in the middle of layer CL1UD with a standard deviation less than half of the thickness of the layer itself.

Layer CL1UD along with layers CL1D1 and CL1D2 form in this way a structure capable of blocking the current flow at the side of the active element.

The penetration of ions, during implantation, is completely barred in the zones covered by photoresist PHO1, the same used as a mask in the preceding step described in FIG. 2; in this manner the process is self-aligned.

The side walls of layers GU1, ACT and GU2 that have been concerned with the ion bombardment with a consequent decrease in the conversion efficiency from electrical energy to optical energy, are removed through selective etching.

Figure 5:
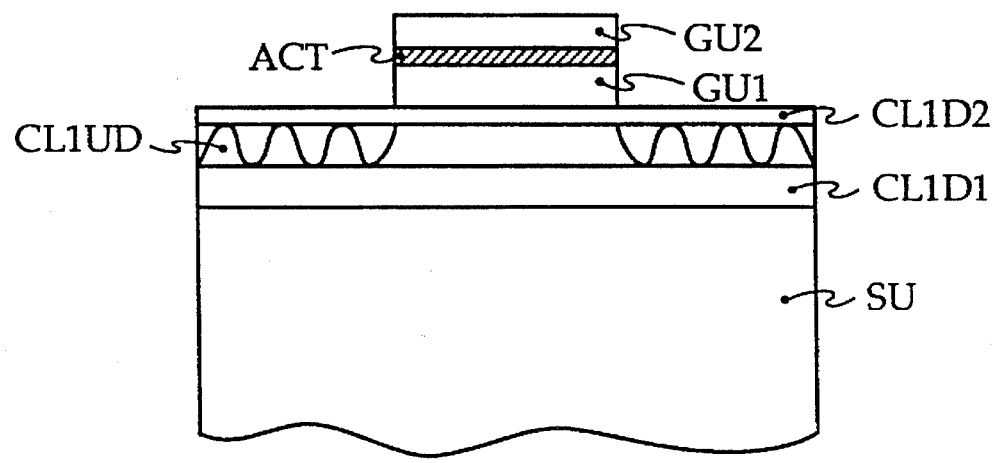
FIG. 5 shows the re-crystallization and activation of the implanted areas.

From FIG. 5 it can be seen that the photoresist PHO1 has been removed and the protection layer PR has been removed as well. The original crystal perfection of the implanted zones is restored through a suitable heat-treatment.

In this manner eventual electrical discontinuities in the implanted layer are eliminated and, moreover, the surface layer, on which a further epitaxial growth will be carried out, is improved.

Such re-crystallization process can be carried out as an independent treatment or as part of the following epitaxial re-growth.

Figure 6:
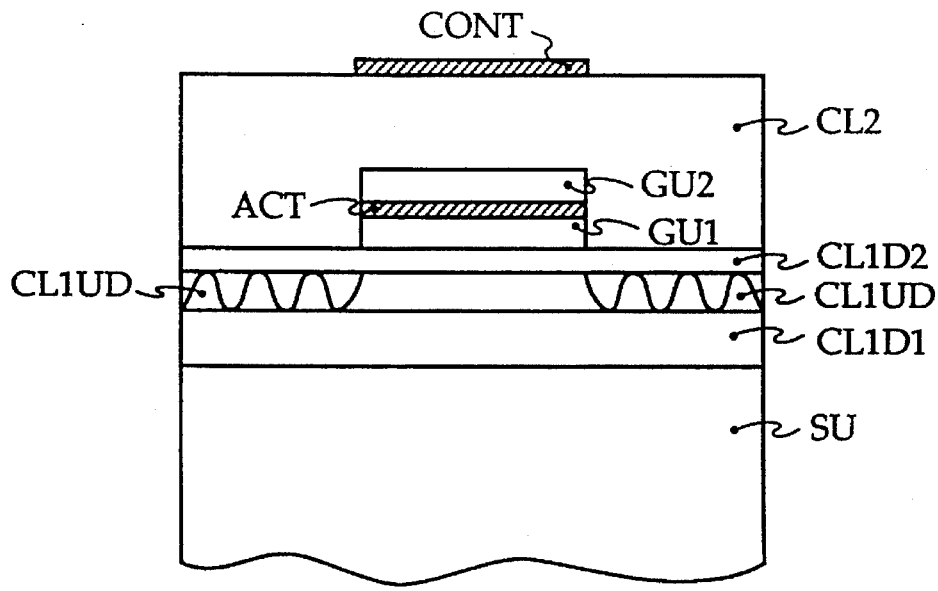
FIG. 6 shows the second epitaxial growth.

FIG. 6 shows that, on the structure thus obtained, a second epitaxial growth of an InGaP layer CL2 is carried out having a thickness suitable for creating, along with layer GU2, a physical isolation structure forming the optical guide between the contact layer CONT and the active layer ACT.

The contact layer CONT is composed of GaAs to facilitate the formation of the subsequent ohmic contact.

Figure 7:
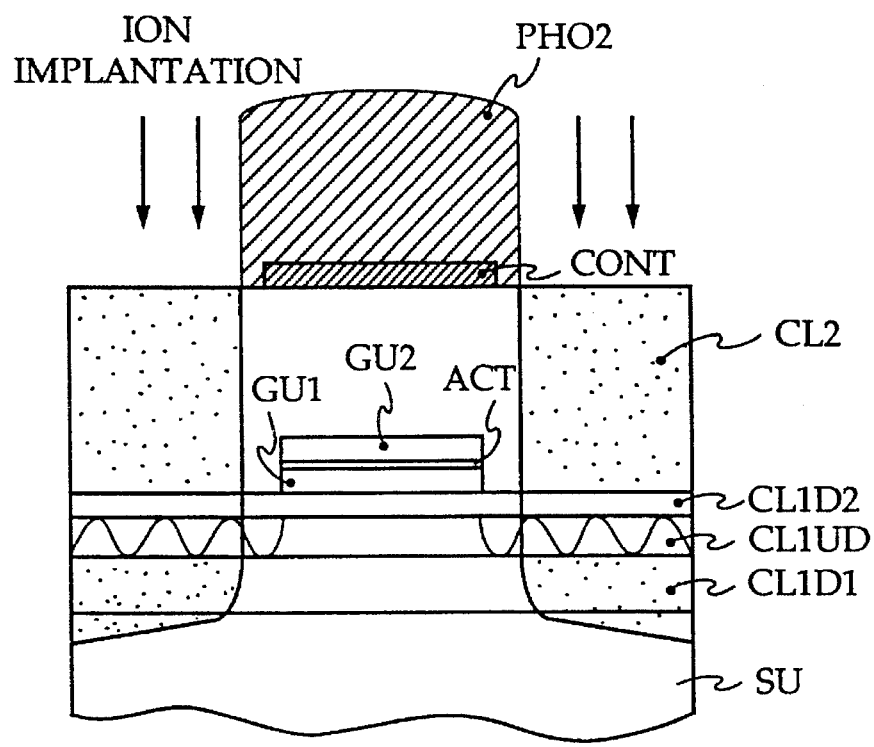
FIG. 7 illustrates that a proton bombardment is carried out.

In FIG. 7 it can be seen that the structure is selectively bombarded with protons only in zones at the side of the active structure, protected through photoresist PHO2 to generate zones with perturbations in the crystal structure. The aim of this step is to reduce the stray capacitances of the device and to further inhibit the electrical conduction. In FIG. 1 one can see the ultimate structure of an embodiment of the invention where the device is completed through vacuum evaporation and heat-treatment of the ohmic contacts OHM that allow the connection of the laser with the intended environment.

An embodiment of the invention has been described here, but devices with such characteristics can be also obtained in other ways, e.g., by doping in a different manner the various layers or by using instead of the above-mentioned materials, other alloys of the elements Ga, As, In, P, Al.

We claim:

1. A semiconductor laser comprising a substrate, means for reducing side current flow and means forming an active element grown from a fabrication growth step, characterized in that said means for reducing the side current flow comprises at least three layers grown from the same fabrication growth step as the means forming the active element, having internal layers which are doped only in side zones with respect to the means forming the active element, wherein the doping of the internal layers is of an opposite type to that of the doping of external layers, whereby said at least three layers reduce the side current flow.

2. A semiconductor laser according to claim 1 wherein the doping of the internal layers is carried out through ion implantation.

3. A semiconductor laser according to claim 2 characterized by being subjected to a heat treatment after having been doped.

4. A semiconductor laser according to claim 1 wherein a perturbation in the crystal structure is created in the zone at the side of the active element.

5. A semiconductor laser according to claim 1 wherein said means forming the active element consist in an active layer placed between several optical confinement layers.

6. A semiconductor laser comprising a substrate, means for reducing side current flow and means forming an active element grown from a fabrication growth step, characterized in that said means for reducing the side current flow comprises at least three layers grown from the same fabrication growth step as the means forming the active element, having internal layers which are doped only in side zones with respect to the means forming the active element, wherein said means for reducing the side current flow are placed beneath the active element, whereby said at least three layers reduce the side current flow.

7. A semiconductor laser according to claim 6, wherein the doping of the internal layers is carried out through ion implantation.

8. A semiconductor laser according to claim 6, wherein a perturbation in the crystal structure is created in the zone at the side of the active element.

9. A semiconductor laser according to claim 6, wherein said means forming the active element consists in an active layer placed between several optical confinement layers.

\* \* \* \* \*

UNITED STATES PATENT AND TRADEMARK OFFICE
CERTIFICATE OF CORRECTION

PATENT NO. : 5,504,769
DATED : April 2, 1996
INVENTOR(S) : Pellegrino et al

It is certified that error appears in the above-indentified patent and that said Letters Patent is hereby corrected as shown below:

On title page, Sec. [56], line 5, please insert --372/46-- at the end of the line.

Signed and Sealed this

Sixth Day of August, 1996

Attest:

BRUCE LEHMAN

Attesting Officer

Commissioner of Patents and Trademarks